United States Patent
Horn et al.

(10) Patent No.: US 10,839,115 B2
(45) Date of Patent: *Nov. 17, 2020

(54) CLEANSING SYSTEM FOR A FEED COMPOSITION BASED ON ENVIRONMENTAL FACTORS

(71) Applicant: UOP LLC, Des Plaines, IL (US)

(72) Inventors: Ian G. Horn, Streamwood, IL (US); Christophe Romatier, Wilmette, IL (US); Paul Kowalczyk, Hoffman Estates, IL (US); Zak Alzein, Burr Ridge, IL (US)

(73) Assignee: UOP LLC, Des Plaines, IL (US)

( * ) Notice: Subject to any disclaimer, the term of this patent is extended or adjusted under 35 U.S.C. 154(b) by 245 days.

This patent is subject to a terminal disclaimer.

(21) Appl. No.: 15/853,689

(22) Filed: Dec. 22, 2017

(65) Prior Publication Data

US 2018/0121581 A1    May 3, 2018

Related U.S. Application Data

(63) Continuation of application No. 15/658,174, filed on Jul. 24, 2017, now Pat. No. 9,864,823, which is a
(Continued)

(51) Int. Cl.
  *G06F 30/20* (2020.01)
  *G01F 15/02* (2006.01)
  *G06F 16/215* (2019.01)

(52) U.S. Cl.
  CPC ........... *G06F 30/20* (2020.01); *G01F 15/022* (2013.01); *G06F 16/215* (2019.01)

(58) Field of Classification Search
  CPC ... G01F 15/022; G06F 16/215; G06F 17/5009
  See application file for complete search history.

(56) References Cited

U.S. PATENT DOCUMENTS

| | | | |
|---|---|---|---|
| 4,159,239 A | 6/1979 | Schwartz | 208/113 |
| 4,267,458 A | 5/1981 | Uram | 290/40 R |

(Continued)

FOREIGN PATENT DOCUMENTS

| | | |
|---|---|---|
| CN | 101346724 A | 1/2009 |
| CN | 102076833 A | 5/2011 |

(Continued)

OTHER PUBLICATIONS

Mar. 4, 2019 U.S. Non-Final Office Action—U.S. Appl. No. 15/858,767.
(Continued)

*Primary Examiner* — Manuel A Rivera Vargas
*Assistant Examiner* — Yaritza H Perez Bermudez

(57) ABSTRACT

A cleansing system for improving operation of a petrochemical plant or refinery. The petrochemical plant or refinery may include a fractionation column, a condenser, and a pump. Equipment, such as condensers, receivers, reboilers, feed exchangers, and pumps may be divided into subsections. Temperatures, pressures, flows, and other plant operations may be used for optimizing plant performance. A cleansing unit performs an enhanced cleansing process, which may allow early detection and diagnosis of the plant operating conditions based on one or more environmental factors.

20 Claims, 4 Drawing Sheets

US 10,839,115 B2

Page 2

Related U.S. Application Data continuation-in-part of application No. 15/084,319, filed on Mar. 29, 2016, now abandoned.

(60) Provisional application No. 62/140,043, filed on Mar. 30, 2015.

(56) References Cited

U.S. PATENT DOCUMENTS

| | | | |
|---|---|---|---|
| 4,284,494 A | 8/1981 | Bartholic | 208/164 |
| 4,362,614 A | 12/1982 | Asdigian | 208/235 |
| 4,380,146 A | 4/1983 | Yannone | 60/39.281 |
| 4,385,985 A | 5/1983 | Gross | 208/113 |
| 4,411,773 A | 10/1983 | Gross | 208/159 |
| 4,709,546 A | 12/1987 | Weiler | 415/116 |
| 4,775,460 A | 10/1988 | Reno | |
| 4,795,545 A | 1/1989 | Schmidt | |
| 4,902,469 A | 2/1990 | Watson | 376/216 |
| 5,077,252 A | 12/1991 | Owen et al. | 502/43 |
| 5,227,121 A | 7/1993 | Scarola | 340/525 |
| 5,582,684 A | 12/1996 | Holmqvist et al. | 162/49 |
| 5,605,435 A | 2/1997 | Haugen | 137/514 |
| 5,616,214 A | 4/1997 | Leclerc | 162/49 |
| 5,642,296 A | 6/1997 | Saxena | 216/84 |
| 5,666,297 A | 9/1997 | Britt et al. | 364/578 |
| 5,817,517 A | 10/1998 | Perry et al. | 436/55 |
| 6,038,540 A | 3/2000 | Krist et al. | 705/8 |
| 6,081,230 A | 6/2000 | Hoshino | 342/357.32 |
| 6,230,486 B1 | 5/2001 | Yasui | 123/674 |
| 6,266,605 B1 | 7/2001 | Yasui | 60/276 |
| 6,271,845 B1 | 8/2001 | Richardson | 715/764 |
| 6,392,114 B1 | 5/2002 | Shields et al. | 582/719 |
| 6,760,716 B1 | 7/2004 | Ganesamoorthi et al. | 706/21 |
| 6,772,044 B1 | 8/2004 | Mathur et al. | 700/204 |
| 6,795,798 B2 | 9/2004 | Eryurek et al. | 702/188 |
| 6,982,032 B2 | 1/2006 | Shaffer et al. | 210/101 |
| 6,983,227 B1 | 1/2006 | Thalhammer-Reyero | |
| 7,006,889 B2 | 2/2006 | Mathur et al. | 700/204 |
| 7,067,333 B1 | 6/2006 | Pasadyn et al. | 438/5 |
| 7,133,807 B2 | 11/2006 | Karasawa | 702/188 |
| 7,151,966 B1 | 12/2006 | Baier et al. | 700/19 |
| 7,246,039 B2 | 7/2007 | Moorhouse | 702/185 |
| 7,313,447 B2 | 12/2007 | Hsuing et al. | 700/9 |
| 7,415,357 B1 | 8/2008 | Stluka et al. | 702/6 |
| 7,567,887 B2 | 7/2009 | Emigholz et al. | 702/182 |
| 7,742,833 B1 | 6/2010 | Herbst et al. | 700/108 |
| 7,836,941 B2 | 11/2010 | Song et al. | |
| 7,877,596 B2 | 1/2011 | Foo Kune et al. | 713/153 |
| 7,925,979 B2 | 4/2011 | Forney et al. | 715/733 |
| 7,936,878 B2 | 5/2011 | Kune et al. | 380/270 |
| 7,979,192 B2 | 7/2011 | Morrison et al. | |
| 7,995,526 B2 | 8/2011 | Liu et al. | 370/329 |
| 8,050,889 B2 | 11/2011 | Fluegge et al. | 702/182 |
| 8,055,371 B2 | 11/2011 | Sanford et al. | 700/108 |
| 8,111,619 B2 | 2/2012 | Liu et al. | 370/229 |
| 8,128,808 B2 | 3/2012 | Hassan et al. | 208/209 |
| 8,204,717 B2 | 6/2012 | McLaughlin et al. | 702/188 |
| 8,244,384 B2 | 8/2012 | Pachner et al. | 700/30 |
| 8,280,057 B2 | 10/2012 | Budampati et al. | 380/270 |
| 8,352,049 B2 | 1/2013 | Hsiung et al. | |
| 8,354,081 B2 | 1/2013 | Wheat et al. | |
| 8,385,436 B2 | 2/2013 | Holm et al. | 375/260 |
| 8,428,067 B2 | 4/2013 | Budampati et al. | 370/395.21 |
| 8,458,778 B2 | 6/2013 | Budampati et al. | 726/6 |
| 8,571,064 B2 | 10/2013 | Kore et al. | 370/469 |
| 8,630,962 B2 | 1/2014 | Maeda | 706/12 |
| 8,644,192 B2 | 2/2014 | Budampati et al. | 370/255 |
| 8,811,231 B2 | 8/2014 | Budampati et al. | 370/255 |
| 8,815,152 B2 | 8/2014 | Burgess et al. | |
| 8,923,882 B2 | 12/2014 | Gandhi et al. | 455/455 |
| 8,926,737 B2 | 1/2015 | Chatterjee et al. | |
| 9,053,260 B2 | 6/2015 | Romatier et al. | |
| 9,134,717 B2 | 9/2015 | Trnka | |
| 9,158,302 B2 | 10/2015 | Thompson | |
| 9,166,667 B2 | 10/2015 | Thanikachalam | |
| 9,176,498 B2 | 11/2015 | Baramov | |
| 9,354,631 B2 | 5/2016 | Mohideen et al. | |
| 9,571,919 B2 | 2/2017 | Zhang et al. | |
| 9,580,341 B1 | 2/2017 | Brown et al. | C02F 3/006 |
| 9,751,817 B2 | 9/2017 | Jani et al. | |
| 9,864,823 B2 | 1/2018 | Horn et al. | |
| 9,968,899 B1 | 5/2018 | Gellaboina et al. | |
| 10,095,200 B2 | 10/2018 | Horn et al. | |
| 10,107,295 B1 | 10/2018 | Brecheisen | |
| 10,180,680 B2 | 1/2019 | Horn et al. | |
| 10,183,266 B2 | 1/2019 | Victor et al. | |
| 10,222,787 B2 | 3/2019 | Romatier et al. | |
| 10,328,408 B2 | 6/2019 | Victor et al. | |
| 2002/0123864 A1 | 9/2002 | Eryurek et al. | 702/188 |
| 2002/0179495 A1 | 12/2002 | Heyse et al. | 208/137 |
| 2003/0036052 A1 | 2/2003 | Delwiche et al. | 435/4 |
| 2003/0105775 A1 | 6/2003 | Shimada | |
| 2003/0147351 A1 | 8/2003 | Greenlee | 370/232 |
| 2003/0223918 A1 | 12/2003 | Cammy | 422/144 |
| 2004/0079392 A1 | 4/2004 | Kuechler | 134/22.19 |
| 2004/0099572 A1 | 5/2004 | Evans | 208/113 |
| 2004/0109788 A1 | 6/2004 | Li et al. | 422/3 |
| 2004/0122273 A1 | 6/2004 | Kabin | 585/639 |
| 2004/0122936 A1 | 6/2004 | Mizelle et al. | |
| 2004/0147036 A1 | 7/2004 | Krenn et al. | 436/119 |
| 2004/0148144 A1 | 7/2004 | Martin | |
| 2004/0204775 A1 | 10/2004 | Keyes | 705/30 |
| 2004/0204913 A1 | 10/2004 | Mueller et al. | |
| 2004/0220689 A1 | 11/2004 | Mathur et al. | 700/97 |
| 2004/0220778 A1 | 11/2004 | Imai et al. | 702/188 |
| 2005/0027721 A1 | 2/2005 | Saenz | 707/100 |
| 2005/0029163 A1 | 2/2005 | Letzsch | 208/113 |
| 2005/0098033 A1 | 5/2005 | Mallavarapu et al. | 95/96 |
| 2005/0133211 A1 | 6/2005 | Osborn et al. | |
| 2005/0216209 A1 | 9/2005 | Evans | 702/45 |
| 2006/0020423 A1 | 1/2006 | Sharpe, Jr. | 702/183 |
| 2006/0133412 A1 | 6/2006 | Callaghan | 370/465 |
| 2006/0252642 A1 | 11/2006 | Kanazirev | |
| 2006/0259163 A1 | 11/2006 | Hsiung et al. | 700/30 |
| 2007/0020154 A1 | 1/2007 | Evans | 422/139 |
| 2007/0059159 A1 | 3/2007 | Hjerpe | 415/117 |
| 2007/0059838 A1 | 3/2007 | Morrison et al. | 436/55 |
| 2007/0091824 A1 | 4/2007 | Budampati et al. | 370/255 |
| 2007/0091825 A1 | 4/2007 | Budampati et al. | 370/255 |
| 2007/0185664 A1 | 8/2007 | Tanaka | 702/56 |
| 2007/0192078 A1 | 8/2007 | Nasle et al. | 703/14 |
| 2007/0212790 A1 | 9/2007 | Welch et al. | 436/139 |
| 2007/0250292 A1 | 10/2007 | Alagappan et al. | 702/184 |
| 2007/0260656 A1 | 11/2007 | Wiig | |
| 2007/0271452 A1 | 11/2007 | Foo Kune et al. | 713/150 |
| 2008/0086322 A1 | 4/2008 | Wallace | 705/1 |
| 2008/0130902 A1 | 6/2008 | Foo Kune et al. | 380/286 |
| 2008/0154434 A1 | 6/2008 | Galloway et al. | |
| 2008/0217005 A1 | 9/2008 | Stluka et al. | 166/250.01 |
| 2008/0222956 A1 | 9/2008 | Tsangaris et al. | |
| 2008/0282606 A1 | 11/2008 | Plaza et al. | |
| 2009/0059786 A1 | 3/2009 | Budampati et al. | 370/230 |
| 2009/0060192 A1 | 3/2009 | Budampati et al. | 380/270 |
| 2009/0064295 A1 | 3/2009 | Budampati et al. | 726/6 |
| 2009/0201899 A1 | 8/2009 | Liu et al. | 370/338 |
| 2009/0204245 A1 | 8/2009 | Sustaeta | 700/99 |
| 2009/0245286 A1 | 10/2009 | Kore et al. | 370/475 |
| 2009/0268674 A1 | 10/2009 | Liu et al. | 370/329 |
| 2009/0281677 A1 | 11/2009 | Botich | 700/295 |
| 2010/0014599 A1 | 1/2010 | Holm et al. | 375/260 |
| 2010/0031560 A1 | 2/2010 | Calabrese et al. | |
| 2010/0108567 A1 | 5/2010 | Medoff | 208/49 |
| 2010/0125347 A1 | 5/2010 | Martin et al. | 700/31 |
| 2010/0152900 A1 | 6/2010 | Gurciullo et al. | |
| 2010/0158764 A1 | 6/2010 | Hedrick | 422/134 |
| 2010/0230324 A1 | 9/2010 | Al-Alloush et al. | 208/82 |
| 2010/0262900 A1 | 10/2010 | Romatier et al. | 715/219 |
| 2011/0112659 A1 | 5/2011 | Pachner et al. | 700/29 |
| 2011/0152590 A1 | 6/2011 | Sadler et al. | 585/313 |
| 2011/0152591 A1 | 6/2011 | Sadler et al. | 585/313 |
| 2011/0311014 A1* | 12/2011 | Hottovy | B01J 19/1837 376/283 |
| 2012/0029966 A1 | 2/2012 | Cheewakriengkrai et al. | 705/7.25 |
| 2012/0083933 A1 | 4/2012 | Subbu et al. | 700/291 |

(56) References Cited

U.S. PATENT DOCUMENTS

| | | | |
|---|---|---|---|
| 2012/0095808 A1* | 4/2012 | Kattapuram | G06Q 10/06375 705/7.37 |
| 2012/0104295 A1 | 5/2012 | Do et al. | 251/129.01 |
| 2012/0121376 A1 | 5/2012 | Huis in Het Veld | 415/1 |
| 2012/0123583 A1 | 5/2012 | Hazen et al. | |
| 2012/0197616 A1 | 8/2012 | Truka | 703/6 |
| 2012/0259583 A1 | 10/2012 | Noboa et al. | |
| 2013/0029587 A1 | 1/2013 | Gandhi et al. | 455/7 |
| 2013/0031960 A1 | 2/2013 | Delrahim | 73/40.5 R |
| 2013/0079899 A1 | 3/2013 | Baramov | 700/32 |
| 2013/0090088 A1 | 4/2013 | Chevsky et al. | 455/411 |
| 2013/0094422 A1 | 4/2013 | Thanikachalam | 370/312 |
| 2013/0172643 A1 | 7/2013 | Pradeep | 585/310 |
| 2013/0253898 A1 | 9/2013 | Meagher et al. | 703/18 |
| 2013/0270157 A1* | 10/2013 | Ferrara | C10G 75/04 208/48 AA |
| 2013/0311437 A1 | 11/2013 | Stluka et al. | 707/706 |
| 2013/0327052 A1 | 12/2013 | O'Neill | 60/772 |
| 2014/0008035 A1 | 1/2014 | Patankar et al. | |
| 2014/0026598 A1 | 1/2014 | Trawicki | 62/56 |
| 2014/0074273 A1 | 3/2014 | Mohideen et al. | 700/98 |
| 2014/0114039 A1 | 4/2014 | Benham et al. | 526/348.5 |
| 2014/0131027 A1 | 5/2014 | Chir | 165/300 |
| 2014/0163275 A1 | 6/2014 | Yanagawa et al. | 585/319 |
| 2014/0179968 A1 | 6/2014 | Yanagawa et al. | 585/476 |
| 2014/0212978 A1 | 7/2014 | Sharpe, Jr. et al. | 436/6 |
| 2014/0294683 A1 | 10/2014 | Siedler | 422/129 |
| 2014/0294684 A1 | 10/2014 | Siedler | 422/129 |
| 2014/0296058 A1 | 10/2014 | Sechrist et al. | 502/53 |
| 2014/0309756 A1 | 10/2014 | Trygstad | 700/31 |
| 2014/0337256 A1 | 11/2014 | Varadi et al. | 706/12 |
| 2014/0337277 A1 | 11/2014 | Asenjo et al. | |
| 2015/0059714 A1 | 3/2015 | Bernards | 123/568.11 |
| 2015/0060331 A1 | 3/2015 | Sechrist et al. | |
| 2015/0077263 A1 | 3/2015 | Ali et al. | 340/679 |
| 2015/0078970 A1 | 3/2015 | Iddir et al. | 422/218 |
| 2015/0098862 A1 | 4/2015 | Lok et al. | 422/49 |
| 2015/0158789 A1 | 6/2015 | Keusenkothen | |
| 2015/0185716 A1 | 7/2015 | Wichmann et al. | 700/287 |
| 2015/0276208 A1 | 10/2015 | Maturana et al. | 700/274 |
| 2015/0284641 A1 | 10/2015 | Shi | 208/113 |
| 2015/0330571 A1 | 11/2015 | Beuneken | 141/4 |
| 2016/0033941 A1 | 2/2016 | T et al. | 700/81 |
| 2016/0048119 A1 | 2/2016 | Wojsznis | 700/11 |
| 2016/0098037 A1 | 4/2016 | Zornio et al. | 700/20 |
| 2016/0098234 A1 | 4/2016 | Weaver | 358/1.15 |
| 2016/0122663 A1 | 5/2016 | Pintar et al. | |
| 2016/0147204 A1 | 5/2016 | Wichmann et al. | 700/287 |
| 2016/0237910 A1 | 8/2016 | Saito | |
| 2016/0260041 A1 | 9/2016 | Horn et al. | |
| 2016/0291584 A1 | 10/2016 | Horn et al. | |
| 2016/0292188 A1 | 10/2016 | Horn et al. | |
| 2016/0292325 A1 | 10/2016 | Horn et al. | |
| 2016/0313653 A1 | 10/2016 | Mink | |
| 2016/0363315 A1 | 12/2016 | Colannino et al. | |
| 2017/0009932 A1 | 1/2017 | Oh | |
| 2017/0058213 A1 | 3/2017 | Oprins | 585/303 |
| 2017/0082320 A1 | 3/2017 | Wang | |
| 2017/0107188 A1 | 4/2017 | Kawaguchi | |
| 2017/0284410 A1 | 10/2017 | Sharpe, Jr. | |
| 2017/0315543 A1 | 11/2017 | Horn et al. | |
| 2017/0323038 A1 | 11/2017 | Horn et al. | |
| 2017/0352899 A1 | 12/2017 | Asai | |
| 2018/0046155 A1 | 2/2018 | Horn et al. | |
| 2018/0081344 A1 | 3/2018 | Romatier et al. | |
| 2018/0082569 A1 | 3/2018 | Horn et al. | |
| 2018/0121581 A1 | 5/2018 | Horn et al. | |
| 2018/0122021 A1 | 5/2018 | Horn et al. | |
| 2018/0155638 A1 | 6/2018 | Al-Ghamdi | 208/79 |
| 2018/0155642 A1 | 6/2018 | Al-Ghamdi et al. | |
| 2018/0197350 A1 | 7/2018 | Kim | |
| 2018/0275690 A1 | 9/2018 | Lattanzio et al. | |
| 2018/0275691 A1 | 9/2018 | Lattanzio et al. | |
| 2018/0275692 A1 | 9/2018 | Lattanzio et al. | |
| 2018/0280914 A1 | 10/2018 | Victor et al. | |
| 2018/0280917 A1 | 10/2018 | Victor et al. | |
| 2018/0282633 A1 | 10/2018 | Van de Cotte et al. | |
| 2018/0282634 A1 | 10/2018 | Van de Cotte et al. | |
| 2018/0282635 A1 | 10/2018 | Van de Cotte et al. | |
| 2018/0283368 A1 | 10/2018 | Van de Cotte et al. | |
| 2018/0283392 A1 | 10/2018 | Van de Cotte et al. | |
| 2018/0283404 A1 | 10/2018 | Van de Cotte et al. | |
| 2018/0283811 A1 | 10/2018 | Victor et al. | |
| 2018/0283812 A1 | 10/2018 | Victor et al. | |
| 2018/0283813 A1 | 10/2018 | Victor et al. | |
| 2018/0283815 A1 | 10/2018 | Victor et al. | |
| 2018/0283816 A1 | 10/2018 | Victor et al. | |
| 2018/0283818 A1 | 10/2018 | Victor et al. | |
| 2018/0284705 A1 | 10/2018 | Van de Cotte et al. | |
| 2018/0286141 A1 | 10/2018 | Van de Cotte et al. | |
| 2018/0311609 A1 | 11/2018 | McCool et al. | |
| 2018/0362862 A1 | 12/2018 | Gellaboina et al. | |
| 2018/0363914 A1 | 12/2018 | Faiella et al. | |
| 2018/0364747 A1 | 12/2018 | Charr et al. | |
| 2019/0002318 A1 | 1/2019 | Thakkar et al. | |
| 2019/0003978 A1 | 1/2019 | Shi et al. | |
| 2019/0015806 A1 | 1/2019 | Gellaboina et al. | |
| 2019/0041813 A1 | 2/2019 | Horn et al. | |
| 2019/0083920 A1 | 3/2019 | Bjorklund et al. | |
| 2019/0101336 A1 | 4/2019 | Victor et al. | |
| 2019/0101342 A1 | 4/2019 | Victor et al. | |
| 2019/0101907 A1 | 4/2019 | Charr et al. | |
| 2019/0102966 A1 | 4/2019 | Lorenz | |
| 2019/0108454 A1 | 4/2019 | Banerjee et al. | |
| 2019/0120810 A1 | 4/2019 | Kumar KN et al. | |
| 2019/0151814 A1 | 5/2019 | Victor et al. | |
| 2019/0155259 A1 | 5/2019 | Romatier et al. | |

FOREIGN PATENT DOCUMENTS

| | | | | |
|---|---|---|---|---|
| CN | 202987967 U | 6/2013 | | |
| CN | 104298818 A | 1/2015 | | |
| EP | 0181744 A1 | 5/1986 | | B65G 53/66 |
| EP | 2746884 A1 | 6/2014 | | G05B 23/02 |
| EP | 2801937 A1 | 11/2014 | | G06Q 10/06 |
| GB | 1134439 A | 11/1968 | | G01N 31/22 |
| JP | 2007271187 A | 10/2007 | | |
| JP | 2009245225 A | 10/2009 | | |
| JP | 2013109711 A | 6/2013 | | |
| KR | 20150004428 A | 1/2015 | | |
| RU | 44840 U1 | 3/2005 | | |
| RU | 63087 U1 | 5/2007 | | |
| WO | WO 1990/010083 A1 | 9/1990 | | C12Q 1/04 |
| WO | WO 2001/060951 A1 | 8/2001 | | C10G 51/04 |
| WO | WO 2006/044408 A1 | 4/2006 | | F23D 14/72 |
| WO | WO 2007/095585 A2 | 8/2007 | | A61K 31/721 |
| WO | 2009046095 A1 | 4/2009 | | |
| WO | WO 2009/046095 A1 | 4/2009 | | G06F 11/00 |
| WO | 2014042508 A1 | 3/2014 | | |
| WO | WO 2014/042508 A1 | 3/2014 | | G06Q 50/04 |
| WO | WO 2014/123993 A1 | 8/2014 | | G06F 17/00 |
| WO | WO 2016/141128 A1 | 9/2016 | | G06Q 10/06 |
| WO | WO 2017/079058 A1 | 5/2017 | | B01D 1/14 |

OTHER PUBLICATIONS

Jan. 18, 2019—(RU) Office Action—App. 2017132728.
Dec. 18, 2018—(SG) Examination Report—App 11201707389V.
Oct. 29, 2018—(JP) Office Action—App 2017-550813.
Dec. 13, 2018—(SG) Examination Report—App 11201707823U.
Aug. 31, 2018—(TH) Office Action—App 1701005738.
Mar. 26, 2019—(RU) Decision of Grant—App 1711385/40RU.
Bespalov A. V. et al., Control systems of chemical and technological processes, pp. 508-509 (2001) (Russian).
Daniel Goebel, Dry Gas Seal Contamination During Operation and Pressurization Hold, [online], Feb. 2016, [retrieved on Jun. 19, 2019]. Retrieved from <https ://core.ac.uk/download/pdf/ 84815277. pdf> (Year: 2016).
EnergyMEDOR®, Product brochure (Nov. 2014).
Chistof Huber, Density and Concentration Measurement Application for Novel MEMS-based Micro Densitometer for Gas, [online], 2016, [retrieved on Jun. 19, 2019]. Retrieved from <https://www. ama-science.org/proceedings/getFile/ZwZ1 BD==> (Year: 2016).

(56) References Cited

OTHER PUBLICATIONS

Lotters, Real-time Composition Determination of Gas Mixtures, [online], 2015, [retrieved on Jun. 19, 2019]. Retrieved from <https://www.ama-science.org/proceedings/getFile/ZwNOZj==> (Year: 2015).
Maybeck, Peter S., "Stochastic models, estimation, and control," vol. 1, Academic Press (1979), 19 pages.
Jan. 2, 2019—U.S. Non-Final Office Action—U.S. Appl. No. 15/858,767.
Jul. 18, 2018—(EP) Search Report—App 16759459.7.
Aug. 13, 2018—(RU) Office Action 2017134552108.
Dec. 14, 2018—(KR) Office Action—App 10-2017-7027847.
Aug. 13, 2018—(RU) Office Action—App 2017133511.
Jan. 24, 2019—U.S. Non-Final Office Action—U.S. Appl. No. 16/154,141.
U.S. Appl. No. 15/058,658, filed Mar. 3, 2015, Ian G. Horn Zak Alzein Paul Kowalczyk Christophe Romatier, System and Method for Managing Web-Based Refinery Performance Optimization Using Secure Cloud Computing.
U.S. Appl. No. 15/640,120, filed Mar. 30, 2015, Ian G. Horn Zak Alzein Paul Kowalczyk Christophe Romatier, Evaluating Petrochemical Plant Errors to Determine Equipment Changes for Optimized Operations.
U.S. Appl. No. 15/851,207, filed Mar. 27, 2017, Louis A. Lattanzio Alex Green Ian G. Horn Matthew R. Wojtowicz, Operating Slide Valves in Petrochemical Plants or Refineries.
U.S. Appl. No. 15/851,343, filed Dec. 21, 2017, Louis A. Lattanzio Alex Green Ian G. Horn Matthew R. Wojtowicz, Early Prediction and Detection of Slide Valve Sticking in Petrochemical Plants or Refineries.
U.S. Appl. No. 15/851,360, filed Mar. 27, 2017, Louis A. Lattanzio Alex Green Ian G. Horn Matthew R. Wojtowicz, Measuring and Determining Hot Spots in Slide Valves for Petrochemical Plants or Refineries.
U.S. Appl. No. 15/853,689, filed Mar. 30, 2015, Ian G. Horn Zak Alzein Paul Kowalczyk Christophe Romatier, Cleansing System for a Feed Composition Based on Environmental Factors.
U.S. Appl. No. 15/858,767, filed Dec. 28, 2017, Ian G. Horn Zak Alzein Paul Kowalczyk Christophe Romatier, Chemical Refinery Performance Optimization.
U.S. Appl. No. 15/899,967, filed Feb. 20, 2018, Joel Kaye, Developing Linear Process Models Using Reactor Kinetic Equations.
U.S. Appl. No. 15/935,827, filed Mar. 28, 2017, Michael R. Van de Cotte Ian G. Horn, Rotating Equipment in a Petrochemical Plant or Refinery.
U.S. Appl. No. 15/935,847, filed Mar. 28, 2017, Michael R. Van de Cotte Ian G. Horn, Rotating Equipment in a Petrochemical Plant or Refinery.
U.S. Appl. No. 15/935,872, filed Mar. 28, 2017, Michael R. Van de Cotte Ian G. Horn, Early Surge Detection of Rotating Equipment in a Petrochemical Plant or Refinery.
U.S. Appl. No. 15/935,898, filed Mar. 28, 2017, Michael R. Van de Cotte Ian G. Horn, Reactor Loop Fouling Monitor for Rotating Equipment in a Petrochemical Plant or Refinery.
U.S. Appl. No. 15/935,920, filed Mar. 28, 2017, Michael R. Van de Cotte Ian G. Horn, Sensor Location for Rotating Equipment in a Petrochemical Plant or Refinery.
U.S. Appl. No. 15/935,935, filed Mar. 28, 2017, Michael R. Van de Cotte Ian G. Horn, Determining Quality of Gas for Rotating Equipment in a Petrochemical Plant or Refinery.
U.S. Appl. No. 15/935,950, filed Mar. 28, 2017, Michael R. Van de Cotte Ian G. Horn, Determining Quality of Gas for Rotating Equipment in a Petrochemical Plant or Refinery.
U.S. Appl. No. 15/935,957, filed Mar. 28, 2017, Michael R. Van de Cotte Ian G. Horn, Using Molecular Weight and Invariant Mapping to Determine Performance of Rotating Equipment in a Petrochemical Plant or Refinery.
U.S. Appl. No. 15/937,484, filed Mar. 28, 2017, Sanford A. Victor Phillip F. Daly Ian G. Horn, Detecting and Correcting Maldistribution in Heat Exchangers in a Petrochemical Plant or Refinery.
U.S. Appl. No. 15/937,499, filed Mar. 28, 2017, Sanford A. Victor Phillip F. Daly Ian G. Horn, Detecting and Correcting Cross-Leakage in Heat Exchangers in a Petrochemical Plain or Refinery.
U.S. Appl. No. 15/937,517, filed Mar. 28, 2017, Sanford A. Victor Phillip F. Daly Ian G. Horn, Strain Gauges and Detecting Pre-Leakage in Heat Exchangers in a Petrochemical Plant or Refinery.
U.S. Appl. No. 15/937,535, filed Mar. 28, 2017, Sanford A. Victor Phillip F. Daly Ian G. Horn, Detecting and Correcting Thermal Stresses in Heat Exchangers in a Petrochemical Plant or Refinery.
U.S. Appl. No. 15/937,588, filed Mar. 28, 2017, Sanford A. Victor Phillip F. Daly Ian G. Horn, Detecting and Correcting Problems in Liquid Lifting in Heat Exchangers.
U.S. Appl. No. 15/937,602, filed Mar. 28, 2017 Sanford A. Victor Phillip F. Daly Ian G. Horn, Air-Cooled Heat Exchangers.
U.S. Appl. No. 15/937,614, filed Mar. 28, 2017, Sanford A. Victor Phillip F. Daly Ian G. Horn, Wet-Cooled Heat Exchanger.
U.S. Appl. No. 15/937,624, filed Mar. 28, 2017, Sanford A. Victor Phillip F. Daly Ian G. Horn, Heat Exchangers in a Petrochemical Plain or Refinery.
U.S. Appl. No. 15/963,840, filed Apr. 28, 2017, Ryan McCool Chad E. Bjorkland Jorge Charr Luk Verhulst, Remote Monitoring of Adsorber Process Units.
U.S. Appl. No. 15/972,974, filed Jun. 20, 2017, Jorge Charr Kevin Carnes Ralph Davis Donald A. Eizenga Christina L. Haasser James W. Harris Raul A. Ohaco Daliah Papoutsis, Incipient Temperature Excursion Mitigation and Control.
U.S. Appl. No. 15/979,421, filed May 14, 2018, Mahesh K. Gellaboina Louis A. Lattanzio, Catalyst Transfer Pipe Plug Detection.
U.S. Appl. No. 16/007,669, filed Jun. 28, 2017, Yili Shi Daliah Papoutsis Jonathan Andrew Tertel, Process and Apparatus to Detect Mercaptans in a Caustic Stream.
U.S. Appl. No. 16/011,600, filed Jun. 19, 2017, Theodore Peter Faiella Colin J. Deller Raul A. Ohaco, Remote Monitoring of Fired Heaters.
U.S. Appl. No. 16/011,614, filed Jun. 19, 2017, Mahesh K. Gellaboina Michael Terry Seth Huber Danielle Schindlbeck, Catalyst Cycle Length Prediction Using Eigen Analysis.
U.S. Appl. No. 16/015,579, filed Jun. 28, 2017, Killol H. Thakkar Robert W. Brafford Eric C. Tompkins, Process and Apparatus for Dosing Nutrients to a Bioreactor.
U.S. Appl. No. 16/133,623, filed Sep. 18, 2017, Chad E. Bjorklund Jeffrey Guenther Stephen Kelley Ryan McCool, Remote Monitoring of Pressure Swing Adsorption Units.
U.S. Appl. No. 16/140,770, filed Oct. 20, 2017, Dinesh Kumar KN Soumendra Mohan Banerjee, System and Method to Optimize Crude Oil Distillation or Other Processing by Inline Analysis of Crude Oil Properties.
U.S. Appl. No. 16/148,763, filed Oct. 2, 2017, Jorge Charr Bryan J. Egolf Dean E. Rende Mary Wier Guy B. Noodle Carol Zhu, Remote Monitoring of Chloride Treaters Using a Process Simulator Based Chloride Distribution Estimate.
U.S. Appl. No. 16/151,086, filed Oct. 5, 2017, Soumendra Mohan Banerjee Deepak Bisht Priyesh Jayendrakumar Jani Krishna Mani Gautam Pandey, Harnessing Machine Learning & Data Analytics for a Real Time Predictive Model for a Fcc Pre-Treatment Unit.
U.S. Appl. No. 16/154,138, filed Oct. 8, 2018, Raul A. Ohaco Jorge Charr, High Purity Distillation Process Control With Multivariable and Model Predictive Control (Mpc) and Fast Response Analyzer.
U.S. Appl. No. 16/154,141, filed Oct. 8, 2018, Ian G. Horn Zak Alzein Paul Kowalczyk Christophe Romatier, System and Method for Improving Performance of a Plant With a Furnace.
U.S. Appl. No. 16/215,101, filed Dec. 10, 2018, Louis A. Lattanzio Christopher Schindlbeck, Delta Temperature Control of Catalytic Dehydrogenation Process Reactors.
U.S. Appl. No. 16/252,021, filed Sep. 16, 2016, Christophe Romatier Zak Alzein Ian G. Horn Paul Kowalczyk David Rondeau, Petrochemical Plant Diagnostic System and Method for Chemical Process Model Analysis.
U.S. Appl. No. 16/253,181, filed Mar. 28, 2017, Ian G. Horn Phillip F. Daly Sanford A. Victor, Detecting and Correcting Vibration in Heat Exchangers.

(56) References Cited

OTHER PUBLICATIONS

U.S. Appl. No. 16/363,406, filed Mar. 30, 2018, Louis A. Lattanzio Abhishek Pednekar, Catalytic Dehydrogenation Reactor Performance Index.
Sep. 22, 2017—U.S. Non-Final Office Action—U.S. Appl. No. 15/658,174.
Feb. 28, 2018—U.S. Non-Final Office Action—U.S. Appl. No. 15/665,042.
Dec. 14, 2017—PCT/U.S. International Search Report—App 2017/051954.
Jan. 26, 2018—U.S. Non-Final Office Action—U.S. Appl. No. 15/640,120.
Jun. 6, 2018—U.S. Final Office Action—U.S. Appl. No. 15/640,120.
Oct. 18, 2018—PCT/U.S. International Search Report—App 2018/044601.
Chatterjee, Tirtha et al., On-line estimation of product properties for crude distillation units, Journal of Process Control 14, 2004, 61-67.

* cited by examiner

CLEANSING SYSTEM FOR A FEED COMPOSITION BASED ON ENVIRONMENTAL FACTORS

CROSS-REFERENCE TO RELATED APPLICATIONS

This application is a continuation of U.S. application Ser. No. 15/658,174, filed Jul. 24, 2017, which is a continuation in part of U.S. application Ser. No. 15/084,319, filed Mar. 29, 2016, which claims priority under 35 U.S.C. § 119(e) of U.S. Provisional Application No. 62/140,043, filed Mar. 30, 2015, each of which is incorporated herein by reference in its entirety.

FIELD

The present disclosure is related to a cleansing processes for a plant, such as a chemical plant or refinery, and more particularly a cleansing process for inferring a feed composition.

BACKGROUND

Companies operating refineries and petrochemical plants typically face tough challenges in today's environment. These challenges may include increasingly complex technologies, a reduction in workforce experience levels, and constantly changing environmental regulations.

Furthermore, as feed and product supplies become more volatile, operators often find it more difficult to make operating decisions that may optimize their approach. This volatility may be unlikely to ease in the foreseeable future, but may represent potential to those companies that can quickly identify and respond to opportunities as they arise.

Outside pressures generally force operating companies to continually increase the usefulness of existing assets. In response, catalyst, adsorbent, equipment, and control system suppliers develop more complex systems that can increase performance. Maintenance and operations of these advanced systems generally requires increased skill levels that may be difficult to develop, maintain, and transfer, given the time pressures and limited resources of today's technical personnel. These increasingly complex systems are not always operated to their highest potential. In addition, when existing assets are operated close to and beyond their design limits, reliability concerns and operational risks may increase.

Plant operators typically respond to the above challenges with one or more strategies, such as, for example, availability risk reduction, working the value chain, and continuous optimization. Availability risk reduction emphasizes achieving adequate plant operations as opposed to maximizing performance. Working the value chain emphasizes improving the match of feed and product mix with asset capabilities and outside demands. Continuous optimization employs tools, systems, and models to continuously monitor and bridge gaps in plant performance.

In a typical data cleansing process, only flow meters are corrected. Data cleansing is performed to correct flow meter calibration and fluid density changes, after which the total error of flow meters in a mass balance envelope is averaged to force a 100% mass balance between the net feed and net product flows. But this conventional data cleansing practice ignores other related process information available (e.g., temperatures, pressures, and internal flows) and does not allow for an early detection of a significant error. Specifically, the errors associated with the flow meters are distributed among the flow meters, and thus it is difficult to detect an error of a specific flow meter.

Typically, plant measurements including sensor data are collected on a continual basis, while laboratory measurements are intermittently sampled and delivered to a laboratory for analysis. Thus, when evaluating plant performance based on the actual operating data, it is often difficult to determine a state of health of the plant operation due to a time lag in receiving plant laboratory data.

In many cases, because the laboratory data is collected at a sparse time interval, such as once a day or week, the laboratory data is unavailable during the interval, and thus becomes outdated. Due to the time to updated laboratory data, the plant operators often use the most recently available set of laboratory data for performance evaluation, and assume that the last laboratory data set is still appropriate for the current operating data. This assumption is frequently misleading and inappropriate because the last laboratory data set may be unreliable at the time of plant performance evaluation.

Therefore, there is a need for an improved data cleansing system and method that performs an early detection and diagnosis of plant operation using environmental factors without substantially relying on laboratory data.

SUMMARY

A general object of the disclosure is to improve operation efficiency of chemical plants and refineries. A more specific object of this disclosure is to overcome one or more of the problems described above. A general object of this disclosure may be attained, at least in part, through a method for improving operation of a plant. The method includes obtaining plant operation information from the plant.

The present disclosure further comprehends a method for improving operation of a plant that includes obtaining plant operation information from the plant and generating a plant process model using the plant operation information. This disclosure still further comprehends a method for improving operation of a plant. The method includes receiving plant operation information over a network, such as the internet, and automatically generating a plant process model using the plant operation information.

An enhanced data cleansing process may allow an early detection and diagnosis of measurement errors based on one or more environmental factors. The environmental factors may include at least one primary factor. The primary factor may include, for example, a temperature, a pressure, a feed flow, a product flow, and/or the like. The environmental factors may include a secondary factor. The secondary factor may include, for example, a density, a specific composition, and/or the like. Using the primary and secondary factors, at least one offset between the measurement and the process model information may be calculated. The offsets may be used to infer the feed composition that corresponds with available plant operation data.

The present disclosure may use configured process models to reconcile measurements within individual process units, operating blocks, and/or complete processing systems. Routine and frequent analysis of model predicted values versus actual measured values may allow early identification of measurement errors, which may be acted upon to minimize impact on operations.

The present disclosure may use process measurements from any of the following devices: pressure sensors, differential pressure sensors, orifice plates, venturi, other flow sensors, temperature sensors, capacitance sensors, weight sensors, gas chromatographs, moisture sensors, and/or other sensors commonly found in the refining and petrochemical industry. Further, the present disclosure may use process laboratory measurements from gas chromatographs, liquid chromatographs, distillation measurements, octane measurements, and/or other laboratory measurements commonly found in the refining and petrochemical industry.

The process measurements may be used to monitor the performance of any of the following process equipment: pumps, compressors, heat exchangers, fired heaters, control valves, fractionation columns, reactors, and/or other process equipment commonly found in the refining and petrochemical industry.

The method of this disclosure may be implemented using a local or web-based computer system. The benefits of executing work processes within this platform may include improved plant performance due to an increased ability by operations to identify and/or capture opportunities, a sustained ability to bridge performance gaps, an increased ability to leverage personnel expertise, and improved enterprise tuning.

A data collection system at a plant may capture data and automatically send captured data to a remote location, where the data may be reviewed to, for example, eliminate errors and biases, and/or used to calculate and report performance results. The performance of the plant and/or individual process units of the plant may be compared to the performance predicted by one or more process models to identify any operating differences or gaps.

A report (e.g., an hourly report, a daily report, a weekly report, a monthly report) showing actual measured values compared to predicted values may be generated and delivered to a plant operator and/or a plant or third party process engineer over a network (e.g., the internet). Identifying performance gaps may allow the operators and/or engineers to identify and resolve the cause of the gaps. In some embodiments, the method may include using the process models and plant operation information to run optimization routines that converge on an optimal plant operation (e.g., for given values of feed, products, and/or prices).

The method of this disclosure may provide plant operators and/or engineers with regular advice that may enable recommendations to adjust setpoints or reference points allowing the plant to run continuously at or closer to optimal conditions. The method of this disclosure may provide the operator alternatives for improving or modifying the future operations of the plant. The method of this disclosure may regularly maintain and/or tune the process models to correctly represent the true potential performance of the plant. The method may include optimization routines configured per specific criteria, which are used to identify optimum operating points, evaluate alternative operations, and/or evaluate feed.

The present disclosure may provide a repeatable method that may help refiners bridge the gap between actual and achievable performance. The method of this disclosure may use process development history, modeling characterization, stream characterization, and/or plant automation experience to address the issues of ensuring data security as well as efficient aggregation, tuning, and movement of large amounts of data. Web-based optimization may enable achieving and sustaining maximum process performance by connecting, on a virtual basis, technical expertise and the plant process operations staff.

The enhanced workflow may use configured process models to monitor, predict, and/or optimize performance of individual process units, operating blocks, or complete processing systems. Routine and frequent analysis of predicted versus actual performance may allow early identification of operational discrepancies that may be acted upon to optimize impact.

As used herein, references to a "routine" refer to a sequence of computer programs or instructions for performing a particular task. References herein to a "plant" refer to any of various types of chemical and petrochemical manufacturing or refining facilities. References herein to a plant "operators" refer to and/or include, without limitation, plant planners, managers, engineers, technicians, and others interested in, overseeing, and/or running the daily operations at a plant.

In some embodiments, a cleansing system may be provided for improving measurement error estimation and detection. A server may be coupled to the cleansing system for communicating with the plant via a communication network. A computer system may include a web-based platform for receiving and sending plant data related to the operation of the plant over the network. A display device may interactively display the plant data. A data cleansing unit may be configured for performing an enhanced data cleansing process for allowing an early detection and diagnosis of the measurement errors of the plant based on at least one environmental factor. A feed estimation unit may be configured for estimating a feed composition associated with the plant based on the calculated offset amount between the measured and simulated values. The feed estimation unit may evaluate the calculated offset amount based on the at least one environmental factor.

In some embodiments, a cleansing method for improving measurement error detection of a plant may include providing a server coupled to a cleansing system for communicating with the plant via a communication network; providing a computer system having a web-based platform for receiving and sending plant data related to the operation of the plant over the network; providing a display device for interactively displaying the plant data, the display device being configured for graphically or textually receiving the plant data; obtaining the plant data from the plant over the network; performing an enhanced data cleansing process for allowing an early detection and diagnosis of the measurement errors of the plant based on at least one environmental factor; calculating and evaluating an offset amount representing a difference between measured and simulated values; estimating a feed composition associated with the plant based on the calculated offset amount between the feed and product information; and/or evaluating the calculated offset amount based on the at least one environmental factor for detecting the error of the equipment during the operation of the plant.

The foregoing and other aspects and features of the present disclosure will become apparent to those of reasonable skill in the art from the following detailed description, as considered in conjunction with the accompanying drawings.

DETAILED DESCRIPTION

Figure 1:
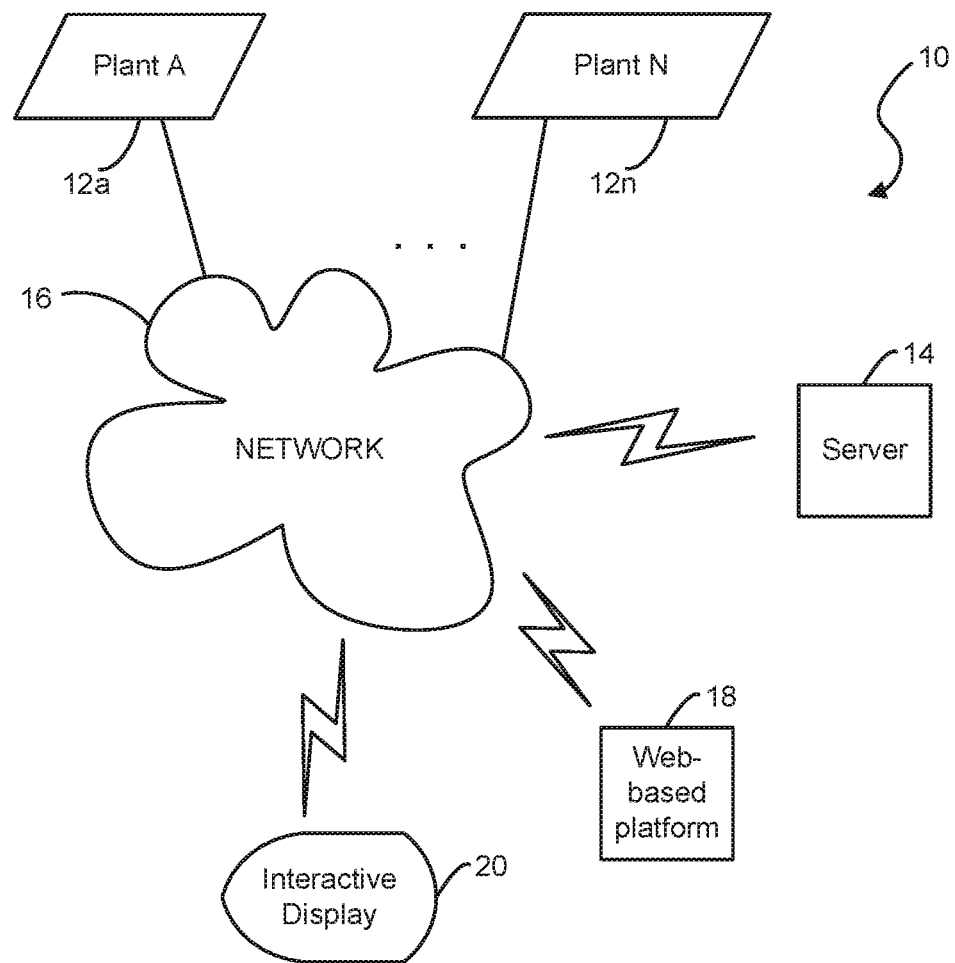
FIG. 1 depicts an illustrative use of a data cleansing system in a network infrastructure in accordance with one or more embodiments of the present disclosure.

Referring now to FIG. 1, an illustrative data cleansing system, generally designated 10, using an embodiment of the present disclosure may be provided for improving operation of one or more plants (e.g., Plant A . . . Plant N) 12a-12n, such as a chemical plant or refinery, or a portion thereof. The present data cleansing system 10 may use plant operation information obtained from one or more plants 12a-12n.

As used herein, the term "system," "unit" or "module" may refer to, be part of, or include an Application Specific Integrated Circuit (ASIC), an electronic circuit, non-transitory memory (shared, dedicated, or group) and/or a computer processor (shared, dedicated, or group) that executes one or more computer-readable instructions (e.g., software or firmware programs), a combinational logic circuit, and/or other suitable components that provide the described functionality. Non-transitory media may be provided that store computer-readable instructions that implement one or more aspects of the disclosure. Thus, while this disclosure includes particular examples and arrangements of the units, the scope of the present system is not so limited, since other modifications will become apparent to the skilled practitioner.

The data cleansing system 10 may reside in or be coupled to a server or computing device 14 (including, e.g., database and video servers), and may be programmed to perform tasks and display relevant data for different functional units via a communication network 16, in some embodiments using a secured cloud computing infrastructure. Other suitable networks may be used, such as the internet, a wireless network (e.g., Wi-Fi), a corporate Intranet, a local area network (LAN), and/or a wide area network (WAN), and the like, using dial-in connections, cable modems, high-speed ISDN lines, and/or other types of communication methods. Relevant information may be stored in databases for retrieval by the data cleansing system 10 or the computing device 14 (e.g., as a data storage device and/or one or more machine-readable data-storage media storing computer programs).

The data cleansing system 10 may be partially or fully automated. In some embodiments, the data cleansing system 10 may be performed by a computer system, such as a third-party computer system, local to or remote from the one or more plants 12a-12n and/or the plant planning center. The data cleansing system 10 may include a web-based platform 18 that obtains or receives and sends information over a network (e.g., the internet). Specifically, the data cleansing system 10 may receive signals and/or parameters from one or more plants 12a-12n via the communication network 16, and may display (e.g., in real time or with a short delay) related performance information on an interactive display device 20 accessible to an operator or user.

Using a web-based system for implementing the method of this disclosure may provide benefits, such as improved plant performance due to an increased ability by plant operators to identify and capture opportunities, a sustained ability to bridge plant performance gaps, and/or an increased ability to leverage personnel expertise and improve training and development. The method of this disclosure may allow for automated daily evaluation of process measurements, thereby increasing the frequency of performance review with less time and effort from plant operations staff.

The web-based platform 18 may allow multiple users to work with the same information, thereby creating a collaborative environment for sharing best practices or for troubleshooting. The method of this disclosure may provide more accurate prediction and optimization results due to fully configured models that may include, for example, catalytic yield representations, constraints, degrees of freedom, and the like. Routine automated evaluation of plant planning and operation models may allow timely plant model tuning to reduce or eliminate gaps between plant models and the actual plant performance. Implementing the method of this disclosure using the web-based platform 18 may also allow for monitoring and/or updating multiple sites, thereby better enabling facility planners to propose realistic optimal targets.

Figure 2:
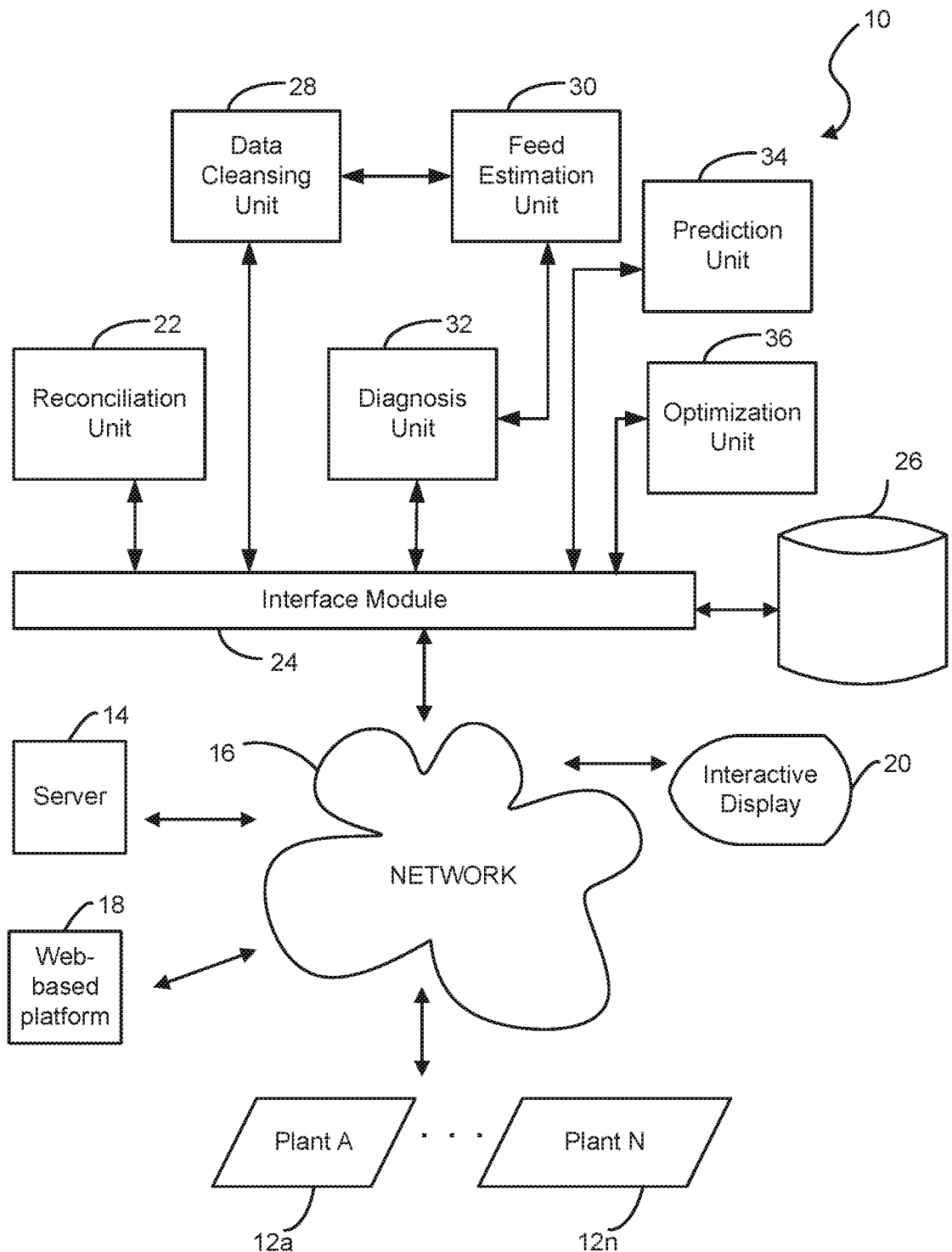
FIG. 2 depicts an illustrative functional block diagram of a data cleansing system featuring functional units in accordance with one or more embodiments of the present disclosure.

Referring now to FIG. 2, the present data cleansing system 10 may include a reconciliation unit 22 configured for reconciling actual measured data from the respective one or more plants 12a-12n with process model results from a simulation engine. The reconciling may be based on a set of reference or set points. In some embodiments, a heuristic analysis may be performed against the actual measured data and the process model results using a set of predetermined threshold values. In some embodiments, the threshold values may be determined from past plant performance. A statistical analysis and/or other suitable analytic techniques may be used to suit different applications.

As an example, plant operating parameters, such as temperatures, pressures, feed compositions, fractionation column product compositions, and/or the like, may be received from the respective one or more plants 12a-12n. These plant parameters may represent the actual measured data from selected pieces of equipment in the one or more plants 12a-12n during a predetermined time period. The reconciliation unit 22 may compare these plant operational parameters with the process model results from the simulation engine based on the predetermined threshold values.

The data cleansing system 10 may include an interface module 24 for providing an interface between the data cleansing system 10, one or more internal or external databases 26, and/or the network 16. The interface module 24 may receive data from, for example, plant sensors via the network 16, and/or other related system devices, services, and applications. The other devices, services, and applications may include, but are not limited to, one or more software or hardware components related to the respective one or more plants 12a-12n. The interface module 24 may also receive the signals and/or parameters, which may be communicated to the respective units and modules, such as the data cleansing system 10, and its associated computing modules or units.

By performing data reconciliation over an entire subsection of the flowsheet, some or all of the process data relating to particular equipment may be used to reconcile the associated operational plant parameters. As described in greater detail below, in some embodiments, at least one plant operational parameter, such as a mass flow rate, may be utilized in the correction of the mass balance. Offsets calculated for the plant measurements may be tracked and stored in the database 26 for subsequent retrieval.

A data cleansing unit 28 may be provided for performing an enhanced data cleansing process for allowing an early detection and diagnosis of plant operation based on one or more environmental factors. As discussed above, the environmental factors may include at least one primary factor. The primary factor may include, for example, a temperature, a pressure, a feed flow, a product flow, and/or the like. The environmental factors may include one or more secondary factors. The secondary factor may include, for example, a density, a specific composition, and/or the like. An offset amount representing a difference between the feed and product information may be calculated and/or evaluated for detecting an error of specific equipment during plant operation.

In operation, the data cleansing unit 28 may receive at least one set of actual measured data from a customer site or one or more plants 12a-12n on a recurring basis at a specified time interval (e.g., every 100 milliseconds, every second, every ten seconds, every minute, every two minutes, every five minutes, every ten minutes, every thirty minutes, every hour). For data cleansing, the received data may be analyzed for completeness and/or corrected for gross errors by the data cleansing unit 28. Then, the data may be corrected for measurement issues (e.g., an accuracy problem for establishing a simulation steady state) and overall mass balance closure to generate a duplicate set of reconciled plant data.

The data cleansing system 10 may include a prediction unit 34 configured to use the corrected data as an input to a simulation process, in which the process model is tuned to ensure that the simulation process matches the reconciled plant data. The prediction unit 34 may perform such that an output of the reconciled plant data is inputted into a tuned flowsheet, and then is generated as a predicted data. Each flowsheet may be a collection of virtual process model objects as a unit of process design. A delta value, which is a difference between the reconciled data and the predicted data, may be validated so that a viable optimization case may be established for a simulation process run.

The data cleansing system 10 may include an optimization unit 36 configured to use the tuned simulation engine as a basis for the optimization case, which may be run with a set of the reconciled data as an input. The output from this step may be a new set of optimized data. A difference between the reconciled data and the optimized data may provide an indication as to how the operations may be changed to reach a greater optimum. In this configuration, the data cleansing unit 28 may provide a user-configurable method for minimizing objective functions, thereby maximizing efficiency of the one or more plants 12a-12n.

A feed estimation unit 30 may be provided for estimating the feed composition associated with specific plant equipment based on the calculated offset amount between the feed (or input) and product (or output) information. Initially, the feed estimation unit 30 may evaluate the calculated offsets between the measured and simulated flow based on the at least one environmental factor for detecting a measurement error during plant operation. As described in greater detail below, a last known reliable feed composition may be established as a base point, and the last known feed composition may be modified to provide more accurate composition data based on the calculated offsets.

The present data cleansing system 10 may include a diagnosis unit 32 configured for diagnosing an operational status of a measurement based on at least one environmental factor. In some embodiments, the diagnosis unit 32 may receive the plant measurements and process simulation from the one or more plants 12a-12n to proactively evaluate a specific piece of plant equipment. To evaluate various limits of a particular process and stay within the acceptable range of limits, the diagnosis unit 32 may determine target tolerance levels of a final product based on actual current and/or historical operational parameters, for example, from a flow rate, a heater, a temperature set point, a pressure signal, and/or the like.

The diagnosis unit 32 may receive the calculated offsets from the feed estimation unit 30 for evaluation. When the offsets are different from previously calculated offsets by a predetermined value, the diagnosis unit 32 may determine that the specific measurement is faulty or in error. In some embodiments, an additional reliability heuristic analysis may be performed on this diagnosis.

In using the kinetic model or other detailed calculations, the diagnosis unit 32 may establish boundaries or thresholds of operating parameters based on existing limits and/or operating conditions. Illustrative existing limits may include mechanical pressures, temperature limits, hydraulic pressure limits, and/or operating lives of various components. Other suitable limits and conditions are contemplated to suit different applications.

Figure 3:
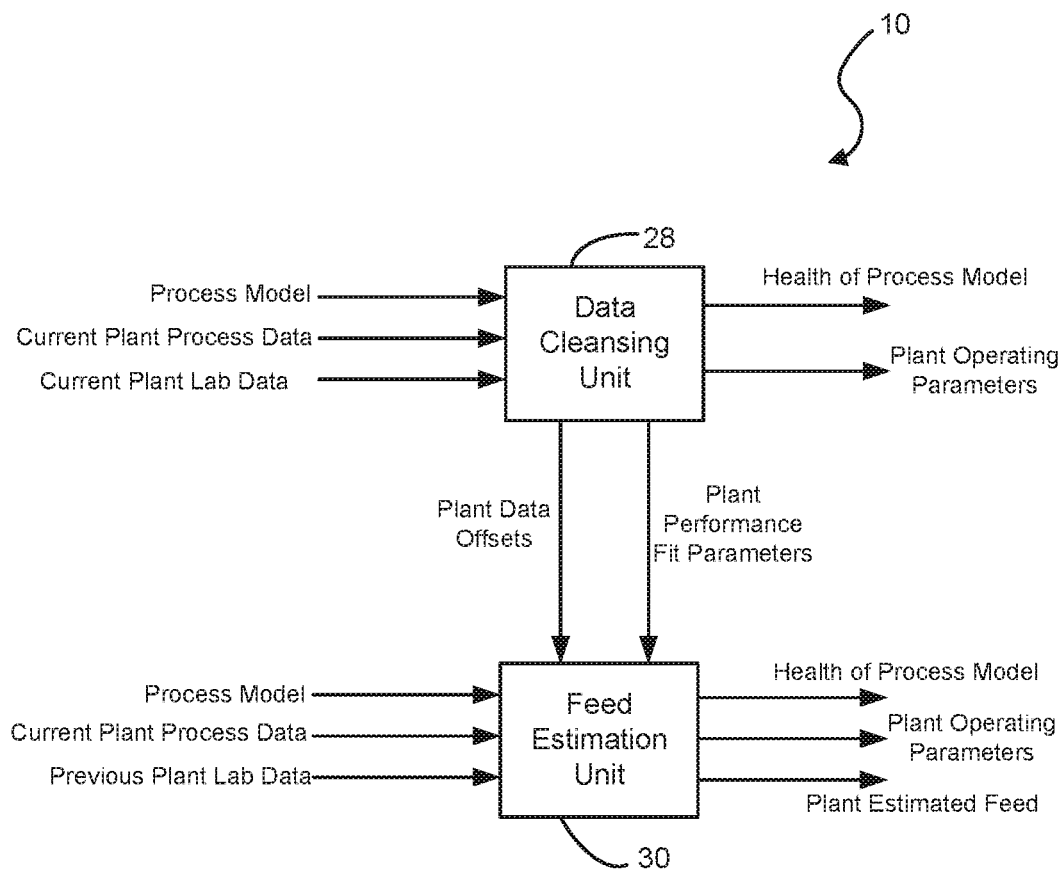
FIG. 3 depicts an illustrative functional block diagram of a data cleansing system featuring an illustrative arrangement of a data cleansing unit and a feed estimation unit in accordance with one or more embodiments of the present disclosure.

Referring now to FIG. 3, an illustrative arrangement of the data cleansing unit 28 and the feed estimation unit 30 is illustrated in accordance with one or more embodiments of the present data cleansing system 10. In some embodiments, the data cleansing unit 28 may receive process model information relating to the current process model of the simulation engine, current plant process data associated with the specific plant equipment, and/or current plant laboratory data associated with the specific plant equipment. The offsets calculated based on the feed and product information may be transmitted to the feed estimation unit 30 for evaluation. In some embodiments, plant performance fit parameters may be transmitted to the feed estimation unit 30.

After the data cleansing unit 28 tunes the process model, the data cleansing unit 28 may determine a state of health of the process model based on the tuning results. For example, the state of health of the process model may be determined based on an error margin measured between the actual measured data and the calculated performance process model results. When the error margin is greater than a predetermined threshold, an alert message or warning signal may be generated to have the plant measurements inspected and rectified. Based on the state of health of the process model, new plant operating parameters may be generated to optimize the performance of the specific plant equipment.

Similarly, the feed estimation unit 30 may receive the process model information, the current plant process data, and/or previous plant laboratory data associated with the specific plant equipment that is reliable for feed estimation analysis. The feed estimation unit 30 may perform evaluation of the calculated offsets based on the plant performance fit parameters for determining the state of health of the process model.

For example, the state of health of the process model may be determined based on a difference of two offsets calculated at two different times. When the difference is greater than a predetermined threshold, another alert message or warning signal may be generated. Based on the state of health of the process model, new plant operating parameters may be generated to optimize the performance of the specific plant equipment.

In some embodiments, the feed estimation unit 30 may infer the feed composition based on the product composition without substantially relying on the previous plant laboratory data. In some embodiments, at least one environmental factor, such as a temperature or pressure level, may be evaluated to determine the reliability of the product composition. When the product composition is determined to be reliable, the feed composition may be estimated or corrected based on the product composition associated with the corresponding plant equipment. For example, a component or ingredient analysis of the product composition may be performed to infer a corresponding ingredient ratio in the feed composition. Conversely, the product composition may be inferred based on the component or ingredient analysis of the feed composition in a reverse order.

Figure 4:
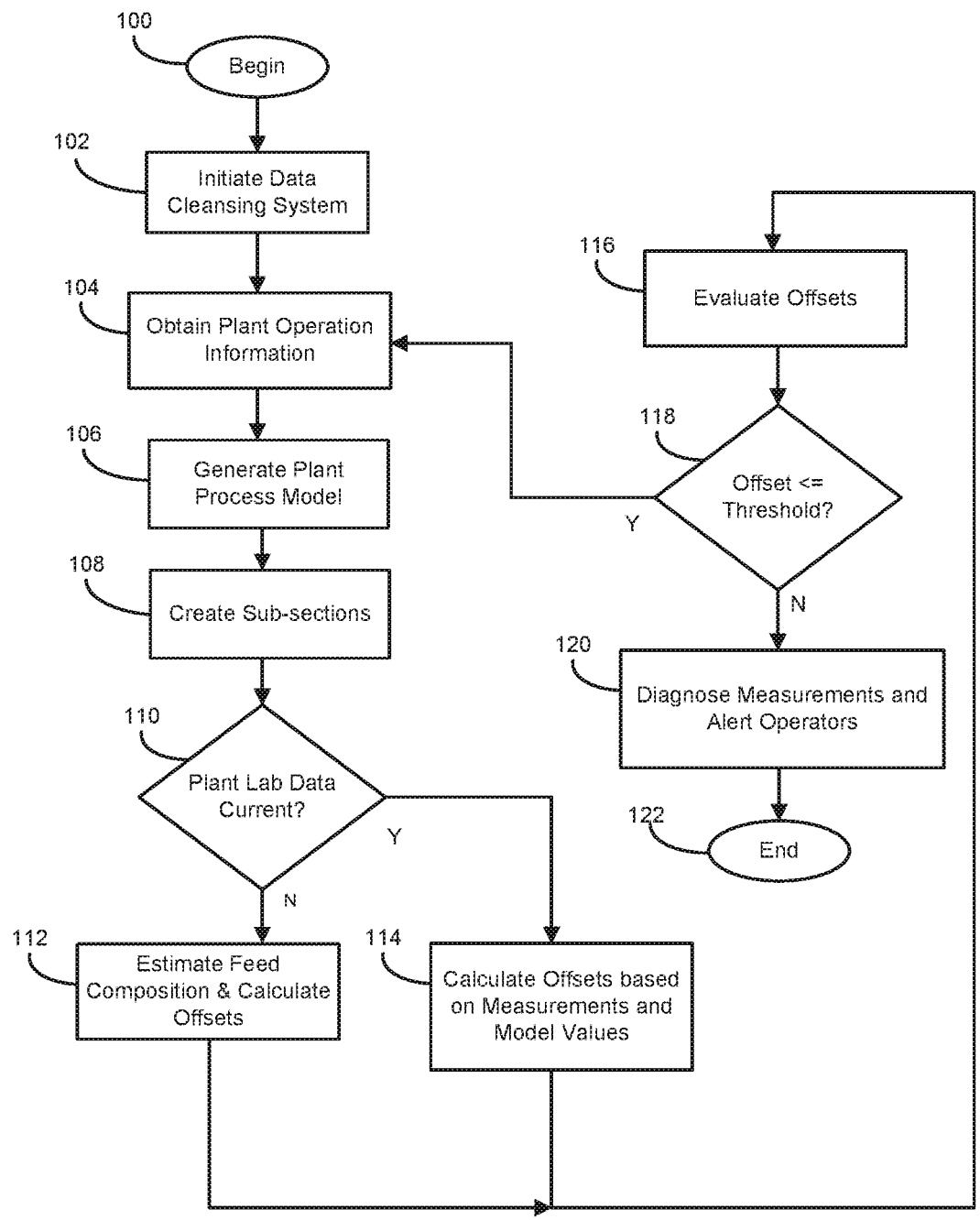
FIG. 4 depicts an illustrative flowchart of a data cleansing method in accordance with one or more embodiments of the present disclosure.

Referring now to FIG. 4, a simplified flow diagram is depicted of an illustrative method of improving operation of a plant, such as the one or more plants 12a-12n of FIGS. 1 and 2, according to some embodiments of this disclosure. Although the following steps are primarily described with respect to the embodiments of FIGS. 1 and 2, the steps within the method may be modified and executed in a different order or sequence without altering the principles of the present disclosure. Additionally, in some embodiments, some steps may be performed more than once, while some steps might not be performed at all.

The method begins at step 100. In step 102, the data cleansing system 10 may be initiated by a computer system that may be local to or remote from the one or more plants 12a-12n. The method may be automatically or manually performed by the computer system. For example, one or more steps may include manual operations or data inputs from the sensors and other related systems.

In step 104, the data cleansing system 10 may obtain plant operation information or plant data from the one or more plants 12a-12n over the network 16. The desirable plant operation information or plant data may include plant operational parameters, plant process condition data or plant process data, plant lab data, and/or information about plant constraints. As used herein, "plant lab data" refers to the results of periodic laboratory analyses of fluids taken from an operating process plant. As used herein, "plant process data" refers to data measured by sensors in the process plant.

In step 106, a plant process model may be generated using the plant operation information. The plant process model may estimate or predict plant performance based upon the plant (e.g., one or more plants 12a-12n) operation information. The plant process model results may be used to monitor the health of the one or more plants 12a-12n and/or to determine whether any upset or poor measurement occurred. The plant process model may be desirably generated by an iterative process that models at various plant constraints to determine the desired plant process model.

In step 108, a process simulation unit may be utilized to model the operation of the one or more plants 12a-12n. Because the simulation for the entire unit may, in some instances, be large and complex to solve in a reasonable amount of time, the one or more plants 12a-12n may be divided into smaller virtual sub-sections consisting of related unit operations. An illustrative process simulation unit, such as a UniSim® Design Suite, is disclosed in U.S. Patent Publication No. 2010/0262900, now U.S. Pat. No. 9,053,260, which is incorporated by reference in its entirety. Other illustrative related systems are disclosed in commonly assigned U.S. patent application Ser. Nos. 15/084,237 and 15/084,291, both filed on Mar. 29, 2016), which are incorporated by reference in their entirety.

For example, in some embodiments, a fractionation column and its related equipment such as its condenser, receiver, reboiler, feed exchangers, and pumps may make up a sub-section. Some or all available plant data from the unit, including temperatures, pressures, flows, and/or laboratory data may be included in the simulation as Distributed Control System (DCS) variables. Multiple sets of the plant data may be compared against the process model for use in calculating model fitting parameters and measurement offsets that generate the smallest errors.

In step 110, the age of the plant lab data may be evaluated against user-defined age criteria. For example, in some embodiments, the plant lab data may be considered to be current if the sample was taken within a threshold amount of time (e.g., one hour, two hours, three hours, four hours, five hours, six hours, seven hours, eight hours, 12 hours, 24 hours, 48 hours, one week) of the current plant process data. If the plant lab data is current, control proceeds to step 114. Otherwise, control proceeds to step 112.

In step 112, when the age of the plant lab data is not current, the plant process data and model calculations may be used to estimate the plant laboratory data that is not current. For example, if the temperature and pressure associated with the product composition are consistent and reliable for a predetermined period, the feed composition may be estimated or corrected based on the last known product composition and/or the current plant process data.

In some embodiments, an offset may be calculated as the difference between plant temperature measurement and the calculated corresponding temperature in the model; as the difference between plant pressure measurement and the calculated corresponding pressure in the model; or as the difference between plant flow measurement and the calculated corresponding flow in the model. Offsets may be calculated for one or more of the plant measurements. In some embodiments, this may be accomplished using an SQP ("Sequential Quadratic Programming") optimizer that may be configured to minimize the sum of the squares of the offsets. In some embodiments, the SQP optimizer that is included in UniSim® Design Suite may be used.

In step 114, offsets and model parameters may be adjusted to provide the best fit between the plant process data and the corresponding model values, and the plant lab data and the corresponding model values. Offsets may be calculated as the differences between the plant process data and plant lab data and the corresponding model variables. Model parameters may be variables in the model that control interactions between the model values that correspond to plant process data or plant lab data.

In some embodiments, an offset may be calculated as the difference between plant temperature measurement and the calculated corresponding temperature in the model; as the difference between plant pressure measurement and the calculated corresponding pressure in the model; as the difference between plant flow measurement and the calculated corresponding flow in the model; or as the difference between plant laboratory measurement and the calculated corresponding composition in the model. Offsets may be calculated for one or more of the plant measurements.

In some embodiments, model parameters may be variables within a process model that govern how measurements interact. As an example, a model parameter may refer to the tray efficiency in a fractionation column, a fouling factor in a heat exchanger, or a reaction rate kinetic parameter in a reactor.

Model parameters and offsets may be chosen such that the offsets between the measured values and the corresponding model values are minimized. In some embodiments, this may be accomplished using an SQP optimizer configured to minimize the sum of the squares of the offsets. In some embodiments, the SQP optimizer that is included in UniSim® Design Suite may be used.

In step 116, the calculated offsets measured between the feed and product information may be evaluated based on evaluation criteria, which may be based on the expected variability of the measurement. In some embodiments, the criteria may be the expected repeatability of the measurement sensor. In some embodiments, the criteria may be a historical statistical repeatability of the measurement, for example, a multiple of the standard deviation of the measurement.

In step 118, when the offset is less than or equal to a predetermined value, control returns to step 104. When the offset is greater than the predetermined value, control proceeds to step 120. Individual measurements with large errors may be eliminated from the fitting algorithm. An alert message or warning signal may be raised to have the measurement inspected and rectified.

In step 120, the operational status of plant equipment may be diagnosed based on the at least one environmental factor and/or the calculated offset. As discussed above, the calculated offset between the feed and product information may be evaluated based on the at least one environmental factor for detecting the fault of specific equipment. It is advantageous that at least one piece of plant equipment may be evaluated and diagnosed for the fault without distributing measurement errors for the rest of plant equipment. As an example, the single feed flow meter and/or one of two product flow meters may be diagnosed based on their temperatures, pressure levels, and/or chemical compositions of each corresponding stream. The method ends at step 122.

Specific Embodiments

While the following is described in conjunction with specific embodiments, this description is intended to illustrate and not limit the scope of the preceding description and the appended claims.

A first embodiment of the disclosure may include a system for improving operation of a plant, the cleansing system including a server coupled to the cleansing system for communicating with the plant via a communication network; a computer system having a web-based platform for receiving and sending plant data related to the operation of the plant over the network; a display device for interactively displaying the plant data; a data cleansing unit configured for performing an enhanced data cleansing process for allowing an early detection and diagnosis of the operation of the plant based on at least one environmental factor, wherein the data cleansing unit calculates and evaluates an offset amount representing a difference between feed and product information for detecting an error of equipment during the operation of the plant based on the plant data; and/or a feed estimation unit configured for estimating a feed composition associated with the equipment of the plant based on the calculated offset amount between the feed and product information, wherein the feed estimation unit evaluates the calculated offset amount based on the at least one environmental factor for detecting the error of the equipment during the operation of the plant. An embodiment of the disclosure is one, any or all of prior embodiments in this paragraph up through the first embodiment in this paragraph, wherein the feed estimation unit is configured to establish a last known feed composition as a base point, and to modify the last known feed composition for providing more accurate composition data based on the calculated offset amount. An embodiment of the disclosure is one, any or all of prior embodiments in this paragraph up through the first embodiment in this paragraph, wherein the data cleansing unit is configured to receive at least one set of actual measured data from the plant on a recurring basis at a predetermined time interval. An embodiment of the disclosure is one, any or all of prior embodiments in this paragraph up through the first embodiment in this paragraph, wherein the data cleansing unit is configured to analyze the received data for completeness and correct an error in the received data for a measurement issue and an overall mass balance closure to generate a set of reconciled plant data. An embodiment of the disclosure is one, any or all of prior embodiments in this paragraph up through the first embodiment in this paragraph, wherein the data cleansing unit is configured such that the corrected data is used as an input to a simulation process in which a process model is tuned to ensure that the simulation process matches the reconciled plant data. An embodiment of the disclosure is one, any or all of prior embodiments in this paragraph up through the first embodiment in this paragraph, wherein the data cleansing unit is configured such that an output of the reconciled plant data is input into a tuned flowsheet, and is generated as a predicted data. An embodiment of the disclosure is one, any or all of prior embodiments in this paragraph up through the first embodiment in this paragraph, wherein the data cleansing unit is configured such that a delta value representing a difference between the reconciled plant data and the predicted data is validated to ensure that a viable optimization case is established for a simulation process run. An embodiment of the disclosure is one, any or all of prior embodiments in this paragraph up through the first embodiment in this paragraph, further including a reconciliation unit configured for reconciling actual measured data from the plant in comparison with a performance process model result from a simulation engine based on a set of predetermined reference or set points. An embodiment of the disclosure is one, any or all of prior embodiments in this paragraph up through the first embodiment in this paragraph, wherein the reconciliation unit is configured to perform a heuristic analysis against the actual measured data and the performance process model result using a set of predetermined threshold values, and wherein the reconciliation unit is configured to receive the plant data from the plant via the computer system, and the received plant data represent the actual measured data from the equipment in the plant during a predetermined time period. An embodiment of the disclosure is one, any or all of prior embodiments in this paragraph up through the first embodiment in this paragraph, further including a diagnosis unit configured for diagnosing an operational status of the equipment by calculating the offset amount based on the at least one environmental factor without distributing a measurement error for the rest of the equipment for the plant. An embodiment of the disclosure is one, any or all of prior embodiments in this paragraph up through the first embodiment in this paragraph, wherein the diagnosis unit is configured to receive the feed and product information from the plant to evaluate the equipment, and to determine a target tolerance level of a final product based on at least one of an actual current operational parameter and a historical operational parameter for detecting the error of the equipment based on the target tolerance level. An embodiment of the disclosure is one, any or all of prior embodiments in this paragraph up through the first embodiment in this paragraph, wherein the data cleansing unit receives process model information relating to at least one of a current process model of a simulation engine, current plant process data associated with the equipment of the plant, and current plant laboratory data associated with the equipment of the plant. An embodiment of the disclosure is one, any or all of prior embodiments in this paragraph up through the first embodiment in this paragraph, wherein the data cleansing unit is configured to transmit the calculated offset and at least one plant performance fit parameter to the feed estimation unit for evaluation. An embodiment of the disclosure is one, any or all of prior embodiments in this paragraph up through the first embodiment in this paragraph, wherein the data cleansing unit is configured to perform a tuning of a process model of a simulation engine, and determine a state of health of the process model based on a tuning result, and wherein a new plant operating parameter is generated based on the state of health of the process model to optimize a performance of the equipment of the plant. An embodiment of the disclosure is one, any or all of prior embodiments in this paragraph up through the first embodiment in this paragraph, wherein the feed estimation unit is configured to perform a feed estimation analysis for inferring the feed composition based on a product composition associated with the equipment of the plant.

A second embodiment of the disclosure is a method for improving operation of a plant, the cleansing method including providing a server coupled to a cleansing system for communicating with the plant via a communication network; providing a computer system having a web-based platform for receiving and sending plant data related to the operation of the plant over the network; providing a display device for interactively displaying the plant data, the display device being configured for graphically or textually receiving the plant data; obtaining the plant data from the plant over the network; performing an enhanced data cleansing process for allowing an early detection and diagnosis of the operation of the plant based on at least one environmental factor; calculating and evaluating an offset amount representing a difference between feed and product information for detecting an error of equipment during the operation of the plant based on the plant data; estimating a feed composition associated with the equipment of the plant based on the calculated offset amount between the feed and product information; and evaluating the calculated offset amount based on the at least one environmental factor for detecting the error of the equipment during the operation of the plant. An embodiment of the disclosure is one, any or all of prior embodiments in this paragraph up through the second embodiment in this paragraph, further including evaluating the at least one environmental factor for a predetermined period to determine a reliability of a product composition associated with the equipment of the plant. An embodiment of the disclosure is one, any or all of prior embodiments in this paragraph up through the second embodiment in this paragraph, further including evaluating the feed and product information of the equipment for detecting the error of the equipment based on a corresponding offset between the feed and product information. An embodiment of the disclosure is one, any or all of prior embodiments in this paragraph up through the second embodiment in this paragraph, further including performing a feed estimation analysis for inferring the feed composition based on a product composition associated with the equipment of the plant. An embodiment of the disclosure is one, any or all of prior embodiments in this paragraph up through the second embodiment in this paragraph, further including diagnosing an operational status of the equipment by calculating the offset amount based on the at least one environmental factor without distributing a measurement error for the rest of the equipment for the plant.

Without further elaboration, by using the preceding description, one skilled in the art may utilize the present disclosure to its fullest extent and easily ascertain the essential characteristics of this disclosure, without departing from the spirit and scope thereof, to make various changes and modifications of the disclosure and to adapt it to various usages and conditions. The preceding specific embodiments are, therefore, to be construed as merely illustrative, and not limiting the remainder of the disclosure in any way whatsoever, and that the disclosure is intended to cover various modifications and equivalent arrangements included within the scope of the appended claims.

In the foregoing, all temperatures are set forth in degrees Celsius and, all parts and percentages are by weight, unless otherwise indicated. While a particular embodiment of the present data cleansing system has been described herein, it will be appreciated by those skilled in the art that changes and modifications may be made thereto without departing from the disclosure in its broader aspects and as set forth in the following claims.

What is claimed is:

1. A cleansing system for a refinery, the cleansing system comprising:
   one or more sensors comprising a flow meter, the one or more sensors configured to collect operation data related to operation of the refinery, the operation data collected from equipment in the refinery, the operation data comprising an environmental factor, feed information, or product information; and
   a feed estimation platform comprising:
      at least one processor; and
      non-transitory computer-readable memory storing executable instructions that, when executed by the at least one processor of the feed estimation platform, cause the feed estimation platform to:
         receive an offset amount representing a difference between the feed information and the product information;
         receive the environmental factor;
         use the environmental factor to evaluate the offset amount representing the difference between the feed information and the product information;
         determine, based on evaluating the offset amount, an equipment error during operation of the refinery; and
         based on determining the equipment error during the operation of the refinery, send a message that causes an adjustment to a flow rate of the refinery to optimize performance of the refinery.

2. The cleansing system of claim 1, further comprising:
   a cleansing platform comprising:
      at least one processor; and
      non-transitory computer-readable memory storing executable instructions that, when executed by the at least one processor of the cleansing platform, cause the cleansing platform to:
         receive a set of actual measured data from the one or more sensors of the refinery on a recurring basis at a predetermined time interval.

3. The cleansing system of claim 2, wherein the non-transitory computer-readable memory of the cleansing platform stores further executable instructions that, when executed by the at least one processor of the cleansing platform, cause the cleansing platform to:

analyze the set of actual measured data for completeness;
correct a first error in the set of actual measured data for a measurement issue;
correct a second error in the set of actual measured data for an overall mass balance closure; and
generate, using the set of actual measured data, a set of reconciled refinery data.

4. The cleansing system of claim 3, wherein the non-transitory computer-readable memory of the cleansing platform stores further executable instructions that, when executed by the at least one processor of the cleansing platform, cause the cleansing platform to:
use the set of actual measured data as an input to a simulation process in which a process model is tuned so that the simulation process matches the set of reconciled refinery data.

5. The cleansing system of claim 3, wherein the non-transitory computer-readable memory of the cleansing platform stores further executable instructions that, when executed by the at least one processor of the cleansing platform, cause the cleansing platform to:
provide an output of the set of reconciled refinery data to a tuned flowsheet; generate predicted data from the output of the set of reconciled refinery data; and
validate a delta value representing a difference between the set of reconciled refinery data and the predicted data to establish a viable optimization case for a simulation process run.

6. The cleansing system of claim 1, further comprising:
a reconciliation platform comprising:
at least one processor; and
non-transitory computer-readable memory storing executable instructions that, when executed by the at least one processor of the reconciliation platform, cause the reconciliation platform to:
receive a set of actual measured data from the one or more sensors of the refinery; and
reconcile the set of actual measured data from the refinery with a performance process model result from a simulation engine based on a set of predetermined reference points.

7. The cleansing system of claim 6, wherein the non-transitory computer-readable memory of the reconciliation platform stores further executable instructions that, when executed by the at least one processor of the reconciliation platform, cause the reconciliation platform to:
perform a heuristic analysis against the set of actual measured data and the performance process model result using a set of predetermined threshold values; and
receive the operation data from the refinery via an interface platform, wherein the received operation data represents the set of actual measured data from the refinery during a predetermined time period.

8. The cleansing system of claim 1, further comprising:
a diagnosis platform comprising:
at least one processor; and
non-transitory computer-readable memory storing executable instructions that, when executed by the at least one processor of the diagnosis platform, cause the diagnosis platform to:
diagnose an operational status of first equipment of the refinery by determining the offset amount without distributing a measurement error for a plurality of different equipment of the refinery.

9. The cleansing system of claim 8, wherein the non-transitory computer-readable memory of the diagnosis platform stores further executable instructions that, when executed by the at least one processor of the diagnosis platform, cause the diagnosis platform to:
receive the feed information and the product information from the refinery; and
determine a target tolerance level of a final product based on at least one of an actual current operational parameter or a historical operational parameter,
wherein the target tolerance level is used for determining the equipment error.

10. The cleansing system of claim 1, wherein the non-transitory computer-readable memory of the feed estimation platform stores further executable instructions that, when executed by the at least one processor of the feed estimation platform, cause the feed estimation platform to:
perform a feed estimation analysis; and
use the feed estimation analysis to infer a feed composition based on a product composition associated with the refinery.

11. A cleansing system for a petrochemical plant, the cleansing system comprising:
one or more sensors comprising a flow meter, the one or more sensors configured to collect operation data related to operation of the petrochemical plant, the operation data collected from equipment in the petrochemical plant, the operation data comprising an environmental factor, feed information, or product information; and
a feed estimation platform comprising:
at least one processor; and
non-transitory computer-readable memory storing executable instructions that, when executed by the at least one processor of the feed estimation platform, cause the feed estimation platform to:
receive an offset amount representing a difference between the feed information and the product information;
receive the environmental factor;
use the environmental factor to evaluate the offset amount representing the difference between the feed information and the product information;
determine, based on evaluating the offset amount, an equipment error during operation of the petrochemical plant; and
based on determining the equipment error during the operation of the petrochemical plant, send a message that causes an adjustment to a flow rate of the petrochemical plant to optimize performance of the petrochemical plant.

12. The cleansing system of claim 11, further comprising:
a cleansing platform comprising:
at least one processor; and
non-transitory computer-readable memory storing executable instructions that, when executed by the at least one processor of the cleansing platform, cause the cleansing platform to:
receive a set of actual measured data from the one or more sensors of the petrochemical plant on a recurring basis at a predetermined time interval.

13. The cleansing system of claim 12, wherein the non-transitory computer-readable memory of the cleansing platform stores further executable instructions that, when executed by the at least one processor of the cleansing platform, cause the cleansing platform to:
analyze the set of actual measured data for completeness;
correct a first error in the set of actual measured data for a measurement issue;

correct a second error in the set of actual measured data for an overall mass balance closure; and generate, using the set of actual measured data, a set of reconciled plant data.

14. The cleansing system of claim 13, wherein the non-transitory computer-readable memory of the cleansing platform stores further executable instructions that, when executed by the at least one processor of the cleansing platform, cause the cleansing platform to:

use the set of actual measured data as an input to a simulation process in which a process model is tuned so that the simulation process matches the set of reconciled plant data.

15. The cleansing system of claim 13, wherein the non-transitory computer-readable memory of the cleansing platform stores further executable instructions that, when executed by the at least one processor of the cleansing platform, cause the cleansing platform to:

provide an output of the set of reconciled plant data to a tuned flowsheet; generate predicted data from the output of the set of reconciled plant data; and validate a delta value representing a difference between the set of reconciled plant data and the predicted data to establish a viable optimization case for a simulation process run.

16. The cleansing system of claim 11, further comprising:
a reconciliation platform comprising:
at least one processor; and
non-transitory computer-readable memory storing executable instructions that, when executed by the at least one processor of the reconciliation platform, cause the reconciliation platform to:
receive a set of actual measured data from the one or more sensors of the petrochemical plant; and
reconcile the set of actual measured data from the petrochemical plant with a performance process model result from a simulation engine based on a set of predetermined reference points.

17. The cleansing system of claim 16, wherein the non-transitory computer-readable memory of the reconciliation platform stores further executable instructions that, when executed by the at least one processor of the reconciliation platform, cause the reconciliation platform to:

perform a heuristic analysis against the set of actual measured data and the performance process model result using a set of predetermined threshold values; and receive the operation data from the petrochemical plant via an interface platform, wherein the received operation data represents the set of actual measured data from the petrochemical plant during a predetermined time period.

18. The cleansing system of claim 11, further comprising:
a diagnosis platform comprising:
at least one processor; and
non-transitory computer-readable memory storing executable instructions that, when executed by the at least one processor of the diagnosis platform, cause the diagnosis platform to:
diagnose an operational status of first equipment of the petrochemical plant by determining the offset amount without distributing a measurement error for a plurality of different equipment of the petrochemical plant.

19. The cleansing system of claim 18, wherein the non-transitory computer-readable memory of the diagnosis platform stores further executable instructions that, when executed by the at least one processor of the diagnosis platform, cause the diagnosis platform to:

receive the feed information and the product information from the petrochemical plant; and determine a target tolerance level of a final product based on at least one of an actual current operational parameter or a historical operational parameter, wherein the target tolerance level is used for determining the equipment error.

20. The cleansing system of claim 11, wherein the non-transitory computer-readable memory of the feed estimation platform stores further executable instructions that, when executed by the at least one processor of the feed estimation platform, cause the feed estimation platform to:

perform a feed estimation analysis; and use the feed estimation analysis to infer a feed composition based on a product composition associated with the petrochemical plant.

* * * * *